US012092967B2

(12) United States Patent
Makino et al.

(10) Patent No.: US 12,092,967 B2
(45) Date of Patent: Sep. 17, 2024

(54) METHOD OF DETERMINING POSITION OF MARK, LITHOGRAPHY METHOD, EXPOSURE APPARATUS, AND ARTICLE MANUFACTURING METHOD

(71) Applicant: CANON KABUSHIKI KAISHA, Tokyo (JP)

(72) Inventors: Ryota Makino, Tochigi (JP); Wataru Yamaguchi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/159,347

(22) Filed: Jan. 25, 2023

(65) Prior Publication Data

US 2023/0236520 A1 Jul. 27, 2023

(30) Foreign Application Priority Data

Jan. 26, 2022 (JP) ................. 2022-010359

(51) Int. Cl.
*G03F 9/00* (2006.01)
*G03F 7/00* (2006.01)

(52) U.S. Cl.
CPC ........ *G03F 9/7088* (2013.01); *G03F 7/70625* (2013.01); *G03F 7/70633* (2013.01); *G03F 9/7092* (2013.01)

(58) Field of Classification Search
CPC ........ G03F 9/7088; G03F 9/7046; G03F 9/70; G03F 9/7003; G03F 9/7007; G03F 9/7011; G03F 9/7015; G03F 9/7019; G03F 9/7023; G03F 9/7049; G03F 9/7065; G03F 9/7069; G03F 9/7073–7096; G03F 7/70625; G03F 7/70633; G03F 7/70605–706851; G03F 7/70; G03F 7/70483–70541
USPC ...... 355/18, 30, 52–55, 67–77; 356/399–401
See application file for complete search history.

(56) References Cited

U.S. PATENT DOCUMENTS

| 11,435,672 | B2 | 9/2022 | Shibazaki | |
| 2008/0094642 | A1* | 4/2008 | Okita | G03F 9/7092 702/94 |
| 2009/0040536 | A1* | 2/2009 | Chiu | G03B 27/42 355/77 |
| 2014/0362363 | A1* | 12/2014 | Cai | G03F 7/70133 355/77 |
| 2019/0146357 | A1* | 5/2019 | Wang | G03F 7/705 430/22 |

FOREIGN PATENT DOCUMENTS

JP          6691693   B2      5/2020

* cited by examiner

*Primary Examiner* — Christina A Riddle
(74) *Attorney, Agent, or Firm* — ROSSI, KIMMS & McDOWELL LLP

(57) ABSTRACT

A method of determining a position of a mark including a first pattern arranged in a first layer of a substrate and a second pattern arranged in a second layer of the substrate, includes determining information concerning the position of the mark as provisional position information based on an image of the mark, acquiring relative position information indicating a relative position between the first pattern and the second pattern, and determining the position of the mark based on the provisional position information and the relative position information.

18 Claims, 10 Drawing Sheets

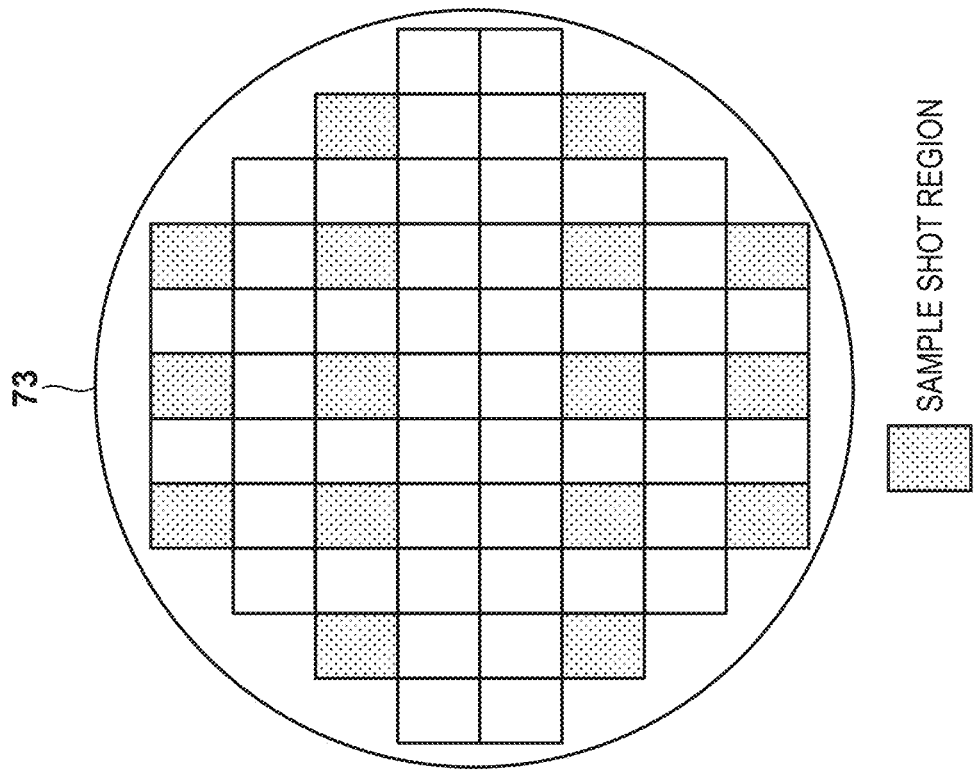
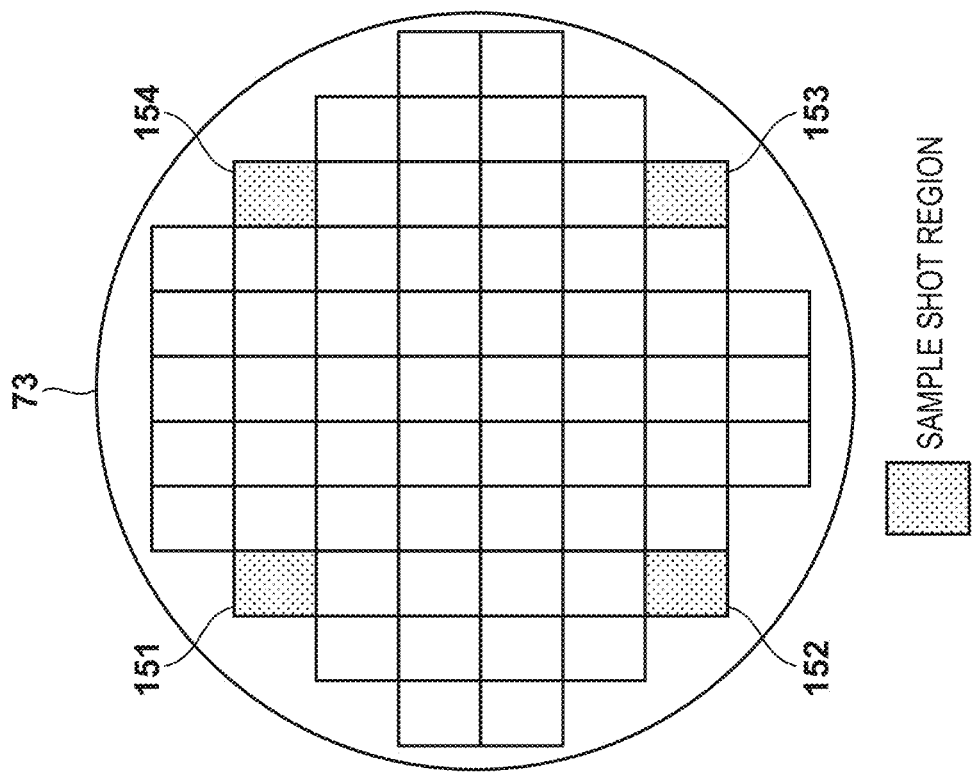

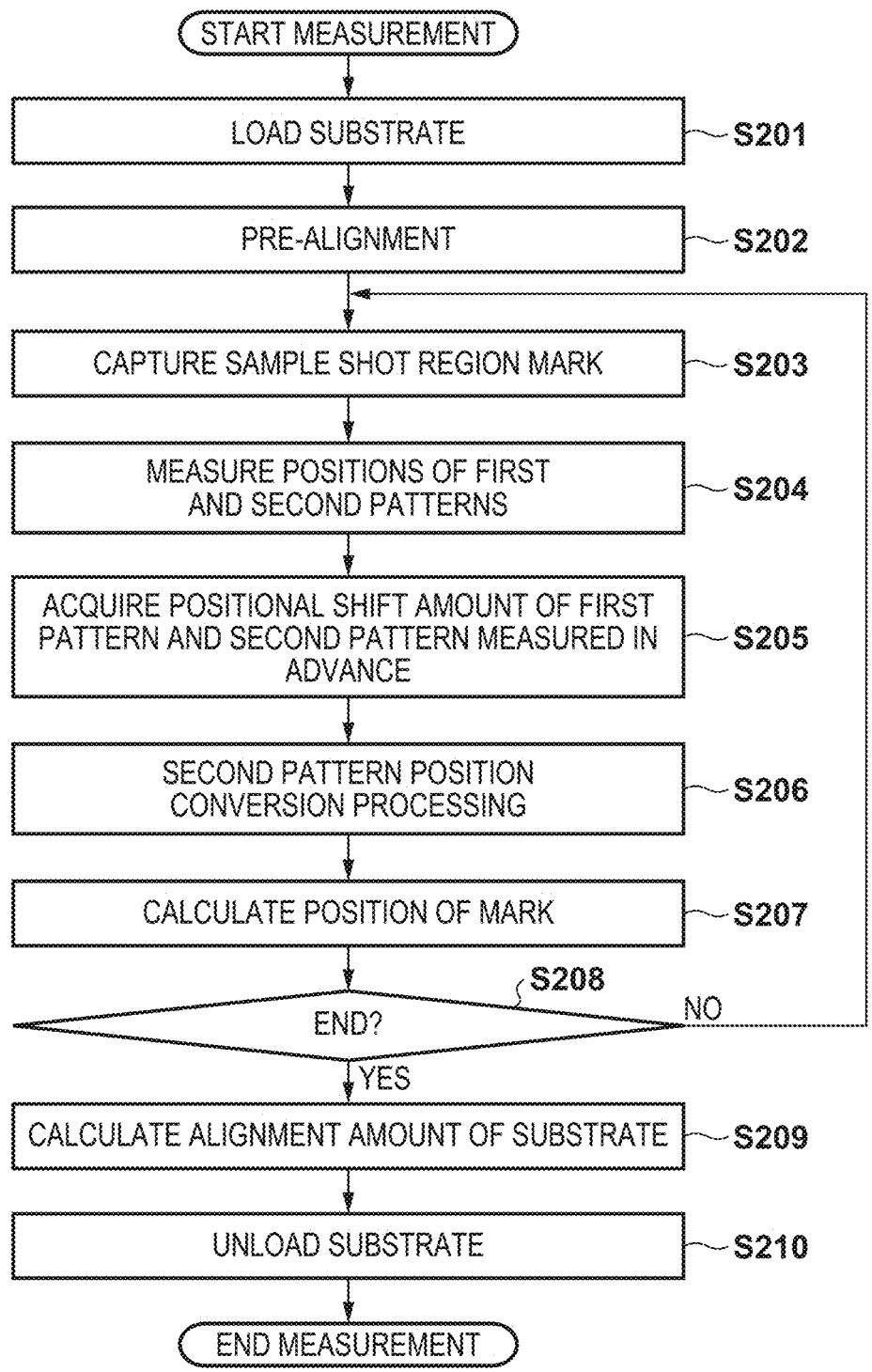

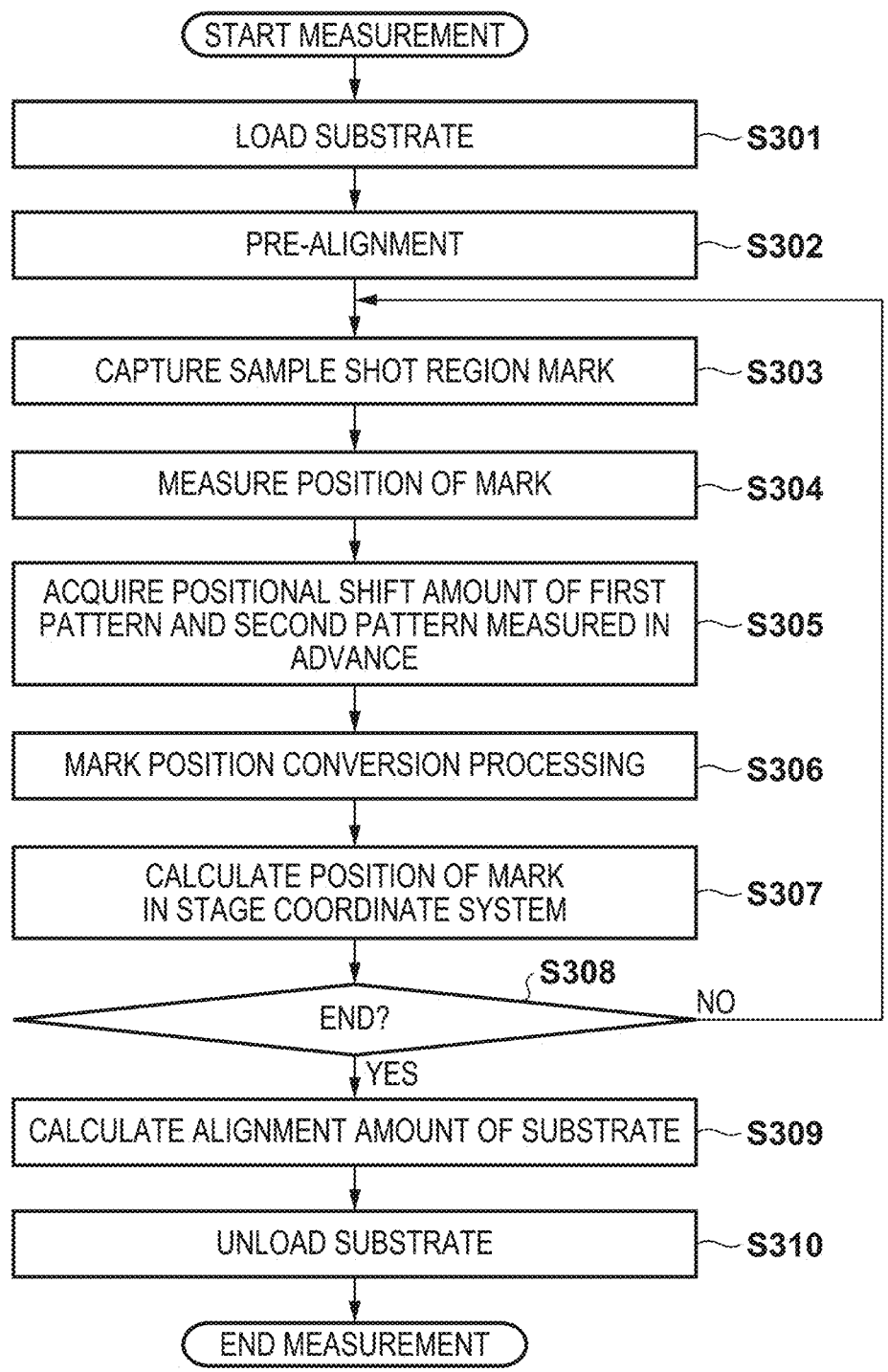

METHOD OF DETERMINING POSITION OF MARK, LITHOGRAPHY METHOD, EXPOSURE APPARATUS, AND ARTICLE MANUFACTURING METHOD

BACKGROUND OF THE INVENTION

Field of the Invention

The present invention relates to a method of determining a position of a mark, a lithography method, an exposure apparatus, and an article manufacturing method.

Description of the Related Art

In recent years, along with high integration and miniaturization of a device, there is an increasing demand for improvement of overlay accuracy. An exposure apparatus can execute global alignment of performing alignment by measuring, for example, the positions of four to eight alignment marks provided in correspondence with shot regions of a substrate, and obtaining the first-order component of the array of the shot regions based on the measurement results. There is proposed a technique in which, in order to implement alignment with high accuracy even if a distortion (substrate distortion) occurs in an array of shot regions in a device manufacturing process, the positions of a large number of alignment marks on the substrate are measured and the substrate distortion is corrected with high accuracy (see Japanese Patent No. 6691693). Substrate distortions that can be corrected by the above-described technique include, in addition the shape of an array of a plurality of shot regions on a substrate, the shape of each shot region. For example, in the technique disclosed in Japanese Patent No. 6691693, correction of the shape of an array of a plurality of shot regions on a substrate and correction of the shape of each shot region are performed using information concerning a substrate distortion acquired in advance.

In recent years, to improve the chip yield in a substrate, miniaturization and reduction of the number of alignment marks arranged on the substrate have been strongly desired. If an overlay inspection mark formed in a plurality of different layers of a substrate is used as an alignment mark, a pattern region is restricted, as compared with an alignment mark in the same occupied region formed in a reference layer, thereby degrading the measurement accuracy and increasing the measurement time.

SUMMARY OF THE INVENTION

The present invention provides a technique advantageous in miniaturization and reduction of the number of marks arranged on a substrate.

One aspect of the present invention provides a method of determining a position of a mark including a first pattern arranged in a first layer of a substrate and a second pattern arranged in a second layer of the substrate, comprising: determining information concerning the position of the mark as provisional position information based on an image of the mark; acquiring relative position information indicating a relative position between the first pattern and the second pattern; and determining the position of the mark based on the provisional position information and the relative position information.

Further features of the present invention will become apparent from the following description of exemplary embodiments with reference to the attached drawings.

BRIEF DESCRIPTION OF THE DRAWINGS

FIGS. 2A and 2B are views each exemplifying an array of a plurality of shot regions of a substrate;

FIG. 4 is a flowchart illustrating measurement processing by the measurement apparatus according to the first embodiment;

FIG. 6 is a flowchart illustrating measurement processing by a measurement apparatus according to the second embodiment;

DESCRIPTION OF THE EMBODIMENTS

Figure 1A:
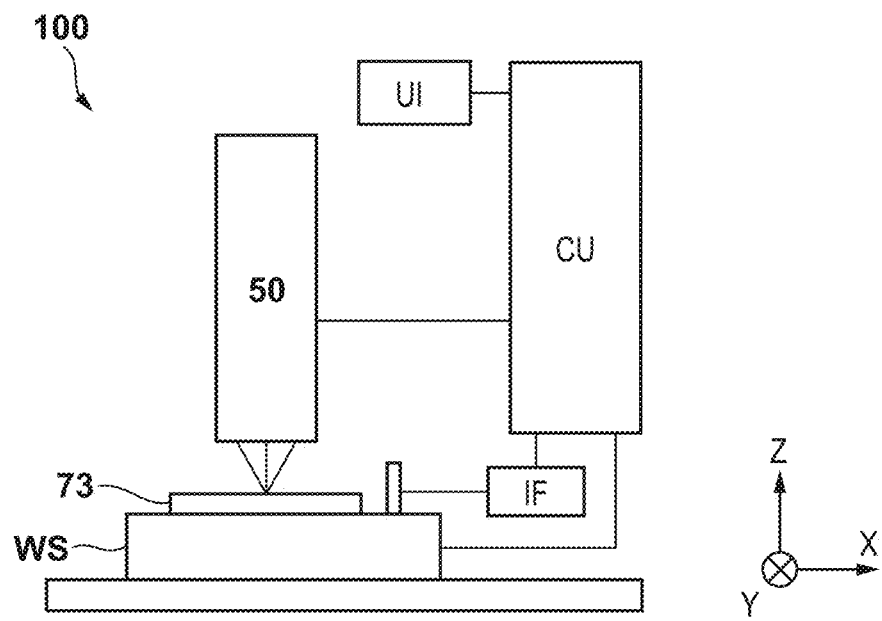
FIG. 1A is a view showing the arrangement of a measurement apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

Figure 1B:
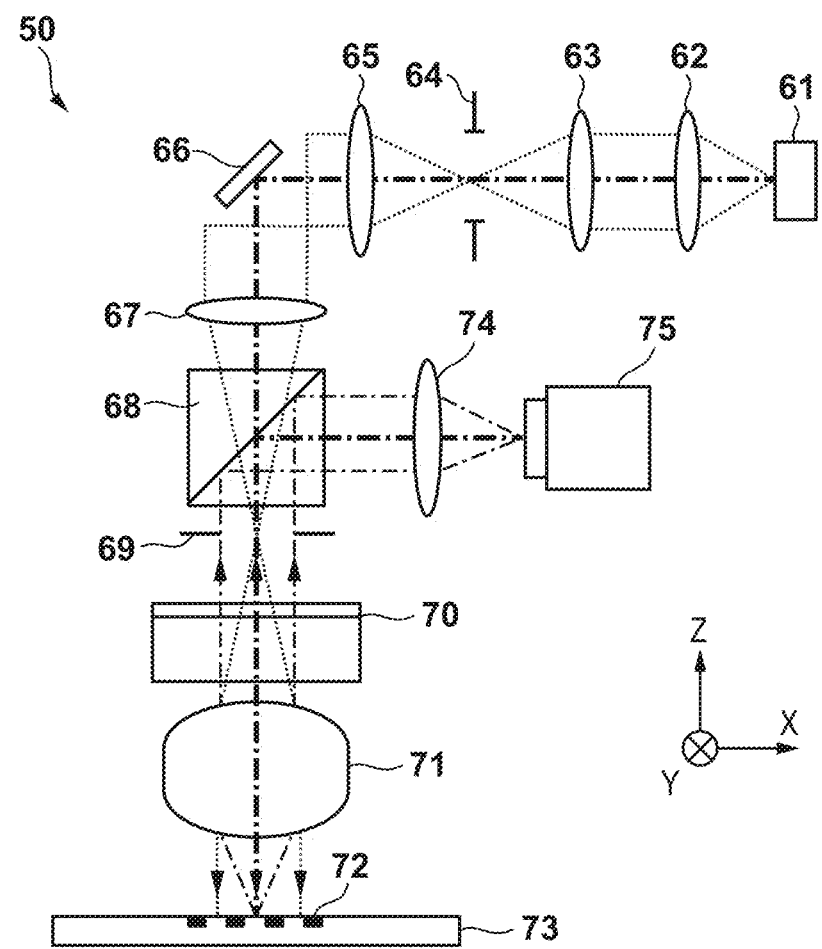
FIG. 1B is a view showing an example of the arrangement of an image capturing unit as one of a plurality of components of the measurement apparatus shown in FIG. 1A.
Figure 3A:
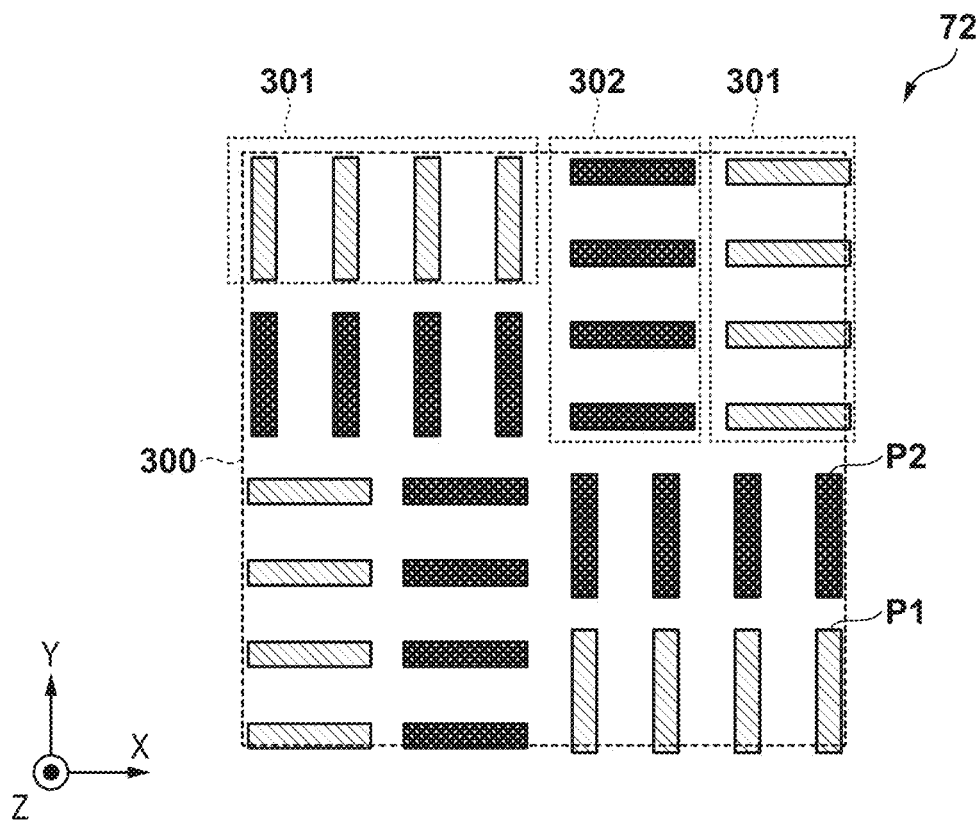
FIGS. 3A and 3B are views showing an example of the arrangement of an overlay inspection mark as an alignment mark.
Figure 3B:
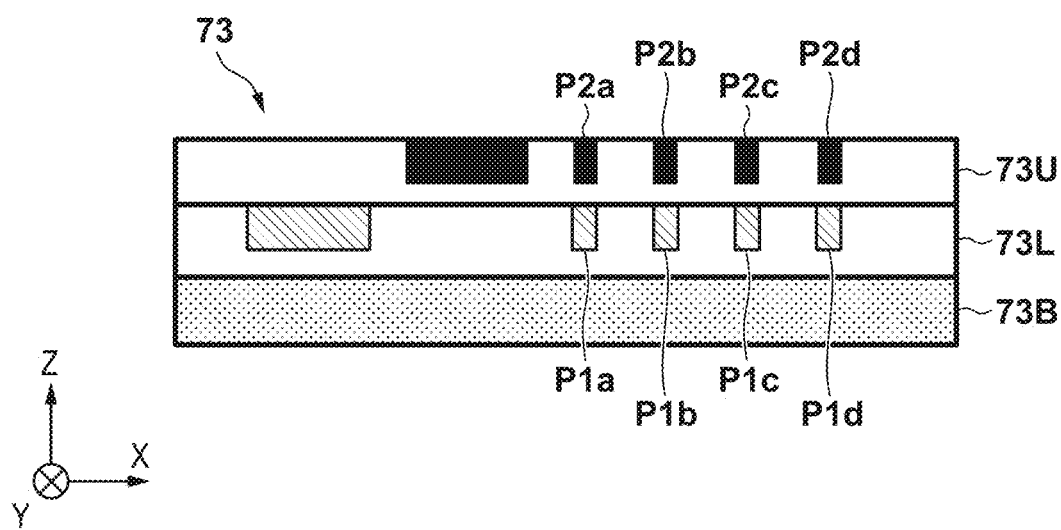

FIG. 1A shows the arrangement of a measurement apparatus 100 according to the first embodiment. FIG. 1B shows an example of the arrangement of an image capturing unit 50 as one of a plurality of components of the measurement apparatus 100. FIGS. 2A and 2B each show an example of the arrangement of a plurality of shot regions on a substrate 73. FIGS. 3A and 3B show an example of a mark 72 arranged on the substrate 73. The measurement apparatus 100 according to the first embodiment will be described below with reference to these drawings.

The measurement apparatus 100 is a measurement apparatus that measures the position of the mark 72 including a first pattern P1 arranged in the first layer (target layer) as the reference of the substrate 73 and a second pattern P2 formed in the second layer different from the first layer. As exemplified in FIG. 1A, the measurement apparatus 100 can include a substrate stage WS that holds the substrate 73, the image capturing unit 50, a controller CU, and an interface UI. The target layer is a layer with which an original pattern is to be aligned when transferring the original pattern to the substrate.

The substrate 73 is a target object for which the shape of the array of the plurality of shot regions on the substrate 73 and the shape of each shot region are measured by the measurement apparatus 100. The substrate 73 is, for example, a substrate that is processed to manufacture a device such as a semiconductor device or a liquid crystal display device. The substrate 73 can be, for example, a wafer or a glass substrate.

The substrate stage WS holds the substrate 73 via a substrate chuck (not shown), and is driven by a substrate driving mechanism (not shown). The substrate driving mechanism includes an actuator such as a linear motor, and can drive the substrate 73 held by the substrate stage WS by driving the substrate stage WS in the X-axis direction, the Y-axis direction, the Z-axis direction, and the rotation directions around the respective axes. The position of the substrate stage WS can be monitored using, for example, a 6-axis laser interferometer IF, and controlled by the controller CU.

The controller CU can be formed by, for example, a PLD (an abbreviation of Programmable Logic Device) such as an FPGA (an abbreviation of Field Programmable Gate Array), an ASIC (an abbreviation of Application Specific Integrated Circuit), a general-purpose or dedicated computer installed with a program, or a combination of all or some of these components. The controller CU can execute a mark position determination method of determining the position of the mark 72 including the first pattern P1 arranged in the first layer of the substrate 73 and the second pattern P2 arranged in the second layer of the substrate 73. The mark position determination method can include a provisional determination step of determining information concerning the position of the substrate 73 as provisional position information based on an image of the mark 72. The mark position determination method can also include an acquisition step of acquiring relative position information indicating the relative position between the first pattern P1 and the second pattern P2. Furthermore, the mark position determination method can include a final determination step of determining the position of the mark 72 based on the provisional position information and the relative position information.

The interface UI is a user interface that includes a display device and an input device and is used to transmit information and instructions from the measurement apparatus 100 to the user or from the user to the measurement apparatus 100. For example, the user can input necessary information to the interface UI via the input device with reference to a screen provided to the display device. The user can designate, for example, a shot region where the position of the mark 72 is to be measured, among the plurality of shot regions of the substrate 73.

An example of the arrangement of the image capturing unit 50 will be described with reference to FIG. 1B. The image capturing unit 50 can include an illumination system that illuminates the substrate 73, an image sensor 75, and an imaging system that images light from the mark 72 of the substrate 73 in the image sensor 75. In the example shown in FIG. 1B, the image capturing unit 50 includes a component shared by the illumination system and the imaging system.

The illumination system will be described first. Light from a light source 61 is guided to an illumination aperture stop 64 via illumination optical systems 62 and 63. The light having passed through the illumination aperture stop 64 is guided to a polarization beam splitter 68 via an illumination optical system 65, a mirror 66, and an illumination optical system 67. The polarization beam splitter 68 transmits P-polarized light parallel to the X direction and reflects S-polarized light parallel to the Y direction. The P-polarized light transmitted through the polarization beam splitter 68 passes through an aperture stop 69, and is then converted into circularly polarized light by a λ/4 plate 70, thereby Koehler-illuminates, via an objective optical system 71, the mark 72 formed in the substrate 73.

The illumination system may include a light quantity adjuster (not shown) and/or a wavelength adjuster (not shown). For example, the light quantity adjuster is configured to arrange, in an optical path from the light source 61, an ND filter selected from a plurality of ND filters having different transmittances, thereby making it possible to adjust the intensity of light illuminating the substrate 73. The wavelength adjuster is configured to arrange, in the optical path from the light source 61, a plurality of wavelength filters which transmit light beams having different wavelength characteristics, thereby making it possible to adjust the wavelength of light illuminating the substrate 73.

The imaging system will be described below. The light reflected, diffracted, and scattered by the mark 72 on the substrate 73 passes through the objective optical system 71 and the λ/4 plate 70 and is guided to the aperture stop 69. The polarization state of the light from the mark 72 is circular polarization that is reverse to the circular polarization of the light illuminating the mark 72. Therefore, if the polarization state of the light illuminating the mark 72 is clockwise circular polarization, the polarization state of the light from the mark 72 is counterclockwise circular polarization. The light converted from circular polarization into S-polarization by the λ/4 plate 70 passes through the aperture stop 69, is reflected by the polarization beam splitter 68, and is guided to the image sensor 75 via an imaging optical system 74.

As described above, in the image capturing unit 50, the polarization beam splitter 68 separates the optical path of the light illuminating the substrate 73 and the optical path of the light from the substrate 73, and an image of the mark 72 on the substrate 73 is formed in the image sensor 75. Based on a signal waveform obtained by detecting the image of the mark 72, the controller CU can determine or acquire the position of the mark 72 in the coordinate system of the image capturing unit 50. The intensity of the signal waveform from the mark 72 can be adjusted by, for example, the light quantity adjuster (ND filter) provided in the illumination system of the image capturing unit 50, the output control of the light source 61, and control of the accumulation time of the image sensor 75. Based on the position of the substrate stage WS obtained using the laser interferometer IF and the position of the mark 72 in the coordinate system of the image capturing unit 50, the controller CU can determine and acquire the position of the mark 72 in the coordinate system of the substrate stage WS.

In the imaging system of the image capturing unit 50, a detection aperture stop may be arranged between the polarization beam splitter 68 and the image sensor 75. Furthermore, it may be possible to adjust the numerical aperture of each of the illumination aperture stop 64 and the detection aperture stop, thereby adjusting a value which is a coefficient representing the ratio of the numerical aperture of the illumination system and the numerical aperture of the imaging system. An example of an arrangement for adjusting the numerical aperture is an arrangement in which an aperture stop arbitrarily selected from a plurality of aperture stops can be arranged in the optical path.

The measurement apparatus 100 can be configured to detect, by the image sensor 75, light (reflected light and scattered light) from the mark 72, or each of the first pattern P1 and the second pattern P2 forming the mark 72. As a method of detecting the light from the mark 72, for example, dark field detection can be adopted in which the aperture stop 64 and the detection aperture stop (the numerical apertures of the illumination system and the imaging system) are controlled to block the 0-order diffracted light from the mark 72 and detect only the higher-order diffracted light and scattered light.

The measurement target of the measurement apparatus 100, that is, the mark 72 on the substrate 73 will be described below. FIGS. 2A and 2B each show an example of the array of the plurality of shot regions of the substrate 73. In the example shown in FIG. 2A, among the plurality of shot regions of the substrate 73, shot regions for which measurement processing (alignment measurement) is performed are sample shot regions 151 to 154. In the peripheral portion of the shot region, a scribe line (not shown) is arranged. If each shot region includes a plurality of chip regions (regions chipped by dicing), a scribe line (not shown) is arranged between adjacent chip regions. On the scribe line, the mark 72 is arranged.

As described above, the mark 72 includes the first pattern P1 arranged in the first layer (target layer) as the reference of the substrate 73, and the second pattern P2 formed in the second layer different from the first layer to be paired with the first pattern P1. That is, the mark 72 can be an overlay inspection mark on the substrate 73.

The reason why the mark 72 used to perform alignment with respect to the target layer is preferably an overlay inspection mark will now be described. The substrate 73 is a target object for which the shape of the array of the plurality of shot regions on the substrate 73 and the shape of each shot region are measured by the measurement apparatus 100. The alignment mark can mainly be provided for measuring the position of a sample shot region. As for the alignment mark, there are various sizes and designs (measurement is performed individually or simultaneously in the X direction and the Y direction) corresponding to the process conditions of the substrate, the detection methods of the alignment optical system (image capturing unit 50) of the apparatus for processing the substrate, and the like. However, to improve the chip yield in the substrate, the area occupied by the alignment mark needs to be decreased, thereby imposing a strict restriction on the number of alignment marks that can be arranged on the scribe line.

On the scribe line between the shot regions, in addition to the alignment mark, an overlay inspection mark for measuring an overlay error of an evaluation target layer with respect to the target layer is also arranged. FIGS. 3A and 3B show an example of the overlay inspection mark for measuring overlay errors in the X direction and the Y direction simultaneously. The combination of the first pattern P1 provided in the target layer and the second pattern P2 in the layer where exposure is newly performed can form the overlay inspection mark. In overlay inspection, the shape of the sample shot region is an inspection target, and thus a plurality of overlay inspection marks are often provided on the scribe line. Therefore, by executing alignment using the overlay inspection mark, the shape of each shot region can be measured in addition to the shape of the array of the plurality of shot regions on the substrate 73.

In the overlay inspection mark, the first pattern P1 can include a plurality of first partial patterns 301, and the second pattern P2 can include a plurality of second partial patterns 302. From one viewpoint, the overlay inspection mark can have a feature that the second pattern P2 falls within a rectangular region 300 circumscribing the first pattern P1. From another viewpoint, the overlay inspection mark can have a feature that at least part of at least one of the plurality of second partial patterns 302 is arranged between at least two first partial patterns 301 among the plurality of first partial patterns 301.

From still another viewpoint, as exemplified in FIGS. 3A and 3B, in the overlay inspection mark, the first pattern P1 is provided in the target layer (first layer) but the second pattern P2 is provided in the layer (second layer) different from the target layer. Thus, if only the first pattern P1 is used as an alignment mark, the line length in the non-measurement direction and the number of lines decrease, as compared with a case in which an alignment mark in the same occupied region is measured, thereby degrading the measurement accuracy. If the number of alignment marks to be measured and the measurement time are increased, the productivity decreases.

To cope with this, this embodiment provides a measurement method and a measurement apparatus that can execute measurement at high speed with high accuracy even if an overlay inspection mark is used as an alignment mark. In this embodiment, the mark 72 used as an alignment mark is an overlay inspection mark including the first pattern P1 arranged in the first layer (target layer) as the reference of the substrate 73 and the second pattern P2 arranged in the second layer different from the first layer.

FIG. 3B schematically shows an example of a section of the substrate 73 on which the mark 72 (overlay inspection mark) is formed. In this example, the substrate 73 includes three layers of a lowermost layer 73B, a first layer 73L as a target layer, and a second layer 73U as a layer positioned by the target layer. A layer which is the target of alignment when forming a pattern on the substrate is determined in advance, and is called a target layer. The first pattern P1 of the target layer 73L includes, for example, four pattern elements P1$a$, P1$b$, P1$c$, and P1$d$, and the second pattern of the layer 73U positioned by the target layer includes, for example, four pattern elements P2$a$, P2$b$, P2$c$, and P2$d$.

A small positional shift amount (a shift amount from a design value) generated when forming the second pattern may exist between the first pattern P1 and the second pattern P2. Therefore, it is difficult to directly use the second pattern P2 as an alignment mark in the target layer 73L.

To cope with this, in this embodiment, the controller CU performs conversion processing of converting the position of the second pattern P2 into the position of the second pattern P2 in the case in which the second pattern P2 is formed without any positional shift from the first pattern P1. This conversion processing is performed based on the relative position information indicating the positional shift amount between the first pattern P1 and the second pattern P2. This makes it possible to use the second pattern P2 as part of the alignment mark in the target layer. The relative position information can be acquired by overlay inspection in the previous step.

The mark position determination method of determining the position of the mark 72 and the measurement method of determining the position and shape of the shot region will be described below with reference to FIG. 4. The mark position determination method and the measurement method are controlled by the controller CU.

In step S201, the substrate 73 is loaded in the measurement apparatus 100. In step S202, pre-alignment is executed. More specifically, the position of a mark for pre-alignment provided on the substrate 73 is measured using the image capturing unit 50, and the position of the substrate 73 is roughly determined based on the measurement result. Pre-alignment in step S202 can be performed at a low resolution for a wide detection range, as compared with capturing of the mark 72 in next step S203.

In step S203, the image capturing unit 50 captures the mark 72. More specifically, based on the result of the pre-alignment, the substrate stage WS is driven to a position at which the image capturing unit 50 can capture the selected mark 72 in the selected sample shot region. Then, the image sensor 75 captures an optical image of the selected mark 72 in the selected sample shot region on the substrate 73, thereby acquiring a captured image. To capture the mark 72, measurement parameter values such as the wavelength of light illuminating the mark 72, a light quantity, the a value, and the focus position (the Z-position of the substrate stage WS) can be adjusted to setting values with which the position of the mark 72 can be measured with high accuracy. The measurement parameter values may be determined in advance based on the past measurement result of the mark 72 and information concerning the structure and the physical characteristic value of the substrate 73. A value for controlling the polarization state of light may be set as a measurement parameter value. As a practical example, in the image capturing unit 50 shown in FIG. 1B, a beam splitter can be arranged instead of the polarization beam splitter 68 and a polarization element can be formed in the illumination system, thereby switching the polarization state.

In step S204, based on the image of the mark 72 captured in step S203, information concerning the position of the mark 72 is determined as provisional position information (that is, the position of the mark 72 is provisionally determined) (provisional determination step). In one example, the provisional position information can include information which is obtained based on the image of the mark 72 and indicates the position of the first pattern P1 in the target layer 73L and the position of the second pattern P2 in the layer 73U positioned by the target layer. In this example, in step S204, based on the image of the mark 72, the position of the first pattern P1 in the target layer 73L and the position of the second pattern P2 in the layer 73U positioned by the target layer are measured or determined.

Figure 5A:
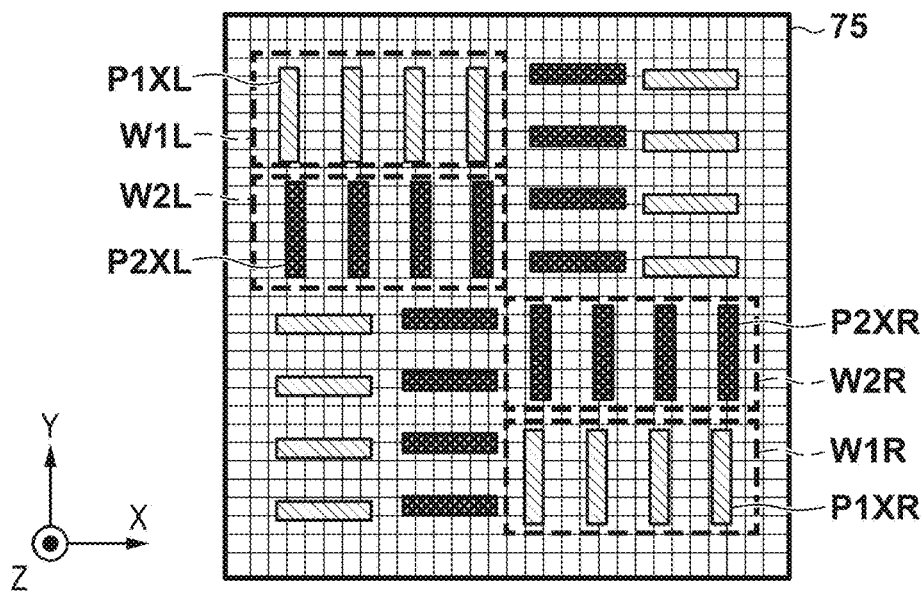
FIGS. 5A to 5C are views for explaining the measurement processing by the measurement apparatus according to the first embodiment.

Measurement processing of measuring the position of the first pattern P1 and the position of the second pattern P2 in step S204 will now be described with reference to FIGS. 5A to 5C. FIG. 5A exemplifies an optical image of the mark 72 formed on the image capturing region (image capturing surface or detection surface) of the image sensor 75 in the image capturing unit 50 shown in FIG. 1B. A two-dimensional image sensor including the image capturing region formed by a plurality of pixels arrayed in the X direction and the Y direction can be used as the image sensor 75. Based on an output (captured image) from the image sensor 75, the controller CU can generate a detection signal including the waveforms corresponding to the first pattern P1 and the second pattern P2.

Figure 5B:
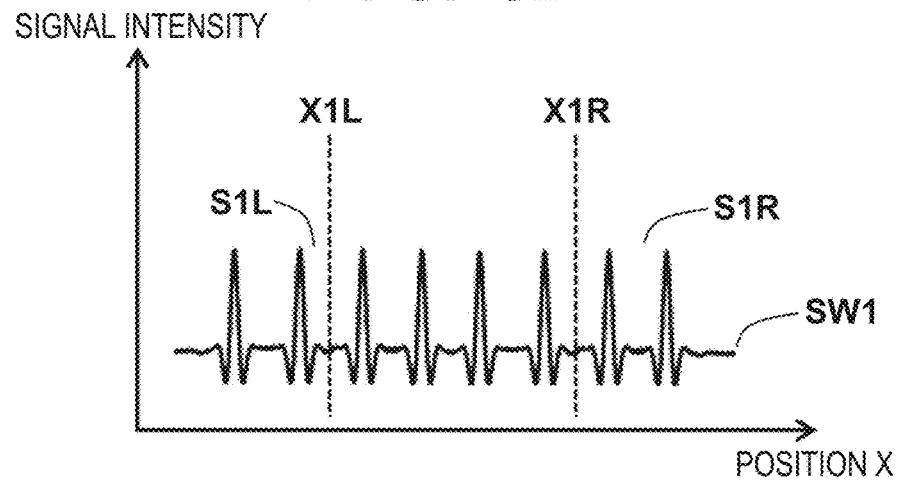
Figure 5C:
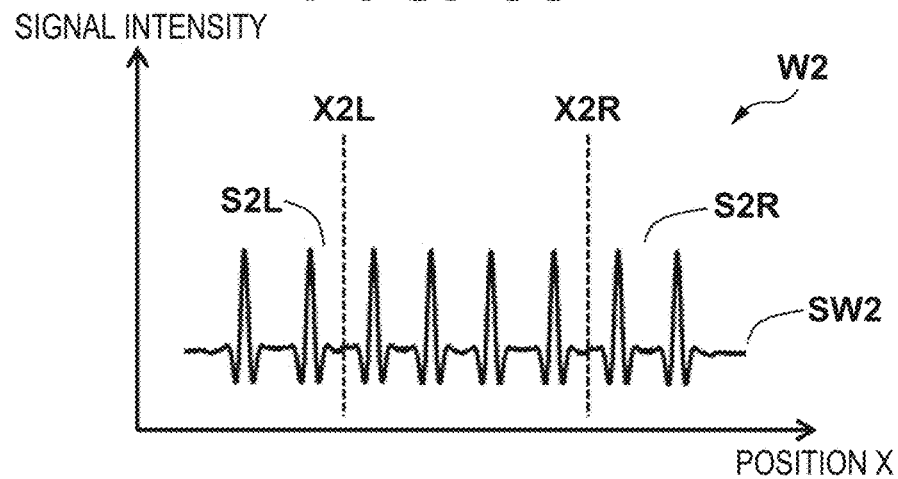

FIG. 5B exemplifies a detection signal SW1 of the first pattern P1 generated when an evaluation region for evaluating the first pattern P1 representing the position in the X direction is set with respect to the captured image obtained by capturing the mark 72 by the image sensor 75. FIG. 5C exemplifies a detection signal SW2 of the second pattern P2 generated when an evaluation region for evaluating the second pattern P2 representing the position in the X direction is set with respect to the captured image obtained by capturing the mark 72 by the image sensor 75.

Based on the designed position of the mark 72, the controller CU can set evaluation regions W1L and W1R to include first partial patterns P1XL and P1XR forming the first pattern P1, respectively, with respect to the image capturing region of the image sensor 75. Based on the designed position of the mark 72, the controller CU can set evaluation regions W2L and W2R to include first partial patterns P2XL and P2XR forming the second pattern, respectively. Each of the detection signals SW1 and SW2 can be generated by integrating the signal intensities of the respective pixels in the set evaluation regions in the Y direction. Note that with respect to the integration of the signal intensities of the respective pixels of the image sensor 75, the number of pixels to be integrated is preferably set based on the dimension information of the mark 72.

As exemplified in FIG. 5B, a waveform S1L included in the detection signal SW1 corresponds to the signal intensity of the first partial pattern P1XL of the first pattern P1, and a waveform S1R included in the detection signal SW1 corresponds to the signal intensity of the first partial pattern P1XR of the first pattern P1. The controller CU obtains a measurement value X1L indicating the central position of the first partial pattern P1XL from the waveform S1L, and obtains a measurement value X1R indicating the central position of the first partial pattern P1XR from the waveform S1R. Based on the measurement values X1L and X1R, the controller CU determines information indicating the position of the first pattern P1 in the X direction. FIG. 5C is a view showing the detection signal SW2 of the second pattern P2. The controller CU can determine information indicating the position of the second pattern P2 in the X direction by the same measurement processing. With respect to the Y direction as well, the same measurement processing is executed for the first pattern P1 and the second pattern P2, and the controller CU can determine information indicating the positions of the first pattern P1 and the second pattern P2 in the Y direction.

In step S205, for example, the controller CU acquires relative position information indicating the relative position (positional shift amount) between the first pattern P1 and the second pattern P2 in the sample shot region measured in advance in overlay shift inspection in the previous step (acquisition step). The relative position information can be saved in the memory or storage device of the controller CU. The first layer 73L as the target layer includes the plurality of first patterns P1, and the second layer 73U as the layer positioned by the target layer includes the plurality of second patterns P2. After the first layer 73L and the second layer 73U are formed on the substrate 73, a measurement step of measuring the relative position can be executed before step S204 (provisional determination step). In the measurement step of measuring the relative position, the relative position between the first pattern P1 selected from the plurality of first patterns P1 and the second pattern P2 corresponding to the selected first pattern P1, among the plurality of second patterns P2, can be measured. The measurement step is typically part of overlay shift inspection in the previous step but may be performed after the overlay shift inspection. In step S205, the controller CU can acquire the relative position information based on the result of the measurement step.

In steps S206 and S207, the controller CU determines the position of the mark 72 based on the provisional position information determined in step S204 (provisional determination step) and the relative position information acquired in step S205 (final determination step). In step S206, the controller CU performs conversion processing of converting the position of the second pattern P2 as the provisional position information determined in step S204 into the position of the second pattern P2 in the case in which the second pattern P2 is formed without any positional shift from the first pattern P1. For example, the position of the second pattern P2 determined in step S204 is represented by (Bx, By), and the relative position information (positional shift amount) acquired in step S205 is represented by (Cx, Cy). In this case, a position (Dx, Dy) of the second pattern P2 in the case in which the second pattern P2 is formed without any positional shift from the first pattern P1 is calculated by:

$$(Dx,Dy)=(Bx-Cx,By-Cy)$$

The conversion processing of calculating (Dx, Dy) may be performed based on an offset value for correcting at least one of:
- a tool induced shift, so-called TIS, which is a measurement error by the measurement apparatus 100 for measuring the mark 72,
- a wafer induced shift, so-called WIS, (for example, an error caused by a difference in the three-dimensional shape of the surface of the mark 72 for each shot region), which is a measurement error by a process of processing the substrate 73, and
- an error caused by a TIS-WIS interaction between the tool induced shift (TIS) and the wafer induced shift (WIS).

In step S207, based on the position of the first pattern P1 as the provisional position information determined in step S204 (provisional determination step) and the position (Dx, Dy) of the second pattern P2 having undergone the conversion processing in step S206, the controller CU determines the position of the mark 72. For example, a position (Ex, Ey) of the mark 72 in the coordinate system of the substrate stage WS can be given by:

$$(Ex,Ey)=((Ax+Dx)/2+WSx,(Ay+Dy)/2+WSy)$$

where (Ax, Ay) represents the position of the first pattern P1 determined in step S204 (provisional determination step). Furthermore, (WSx, WSy) represents the position of the substrate stage WS at the time of capturing the mark 72.

For example, a position (ex, ey) of the mark 72 in the coordinate system of the image capturing unit 50 (the position of the mark 72 in the visual field of the image capturing unit 50) can be given by:

$$(ex,ey)=((Ax+Dx)/2,(Ay+Dy)/2)$$

As described above, as a method of determining the position of the mark 72, there is provided a method of using the average value of the position (Ax, Ay) of the first pattern P1 and the position (Dx, Dy) of the second pattern P2 having undergone the conversion processing. Furthermore, as another method, the position of the mark 72 may be obtained by weighting each of the position (Ax, Ay) of the first pattern P1 and the position (Dx, Dy) of the second pattern P2 having undergone the conversion processing. For example, the ratio between the signal intensities or contrasts of the first pattern P1 and the second pattern P2, which can be calculated from the detection signal waveforms of the first pattern P1 and the second pattern P2 obtained based on the captured image of the mark 72, can be used as a weighting evaluation parameter.

In step S208, the controller CU determines whether the positions of all the marks 72 in all the sample shot regions on the substrate 73 are obtained. Then, if it is not determined that the positions of all the marks 72 in all the sample shot regions on the substrate 73 are obtained, the substrate stage WS is driven to the position for measuring the position of the next mark 72, and steps S203 to S207 are executed for the next mark 72. On the other hand, if the positions of all the marks 72 in all the sample shot regions on the substrate 73 are obtained, the process advances to step S209.

In step S209, the controller CU calculates the alignment amount of the substrate 73 based on the measured positions of all the marks 72 in all the sample shot regions. More specifically, based on data of the design coordinate values and the actual measurement values (differences from the design coordinate values) of the marks 72 in the sample shot regions, the alignment amount of the coordinate value of each shot region can be obtained by a statistic operation such as a least square method. The degree of a model formula used by a least square method is determined by the arrangement and number of set sample shot regions. For example, if the total number of shot regions on the substrate is 64 and the number of sample shot regions is 4, as shown in FIG. 2A, the shift of the substrate and a primary linear component (magnification and rotation) are obtained as the alignment amount. If the number of sample shot regions is set to 16 in the arrangement shown in FIG. 2B, the model formula representing the alignment amount (dx, dy) of the coordinate value of each shot region is given by:

$$dx = a_0 + a_1 \cdot X + a_2 \cdot Y + a_3 \cdot X^2 + a_4 \cdot X \cdot Y + a_5 \cdot Y^2 + a_6 \cdot X^3 + a_7 \cdot X^2 \cdot Y + a_8 \cdot X \cdot Y^2 + a_9 \cdot Y^3$$

$$dy = b_0 + b_1 \cdot X + b_2 \cdot Y + b_3 \cdot X^2 + b_4 \cdot X \cdot Y + b_5 \cdot Y^2 + b_6 \cdot X^3 + b_7 \cdot X^2 \cdot Y + b_8 \cdot X \cdot Y^2 + b_9 \cdot Y^3 \quad (1)$$

The alignment amount of the coordinate value of each shot region when all the shot regions on the substrate are set as sample shot regions is obtained by preferably selecting one of the above-described model formula by a least square method and shift correction for each shot region.

If the positions of the plurality of marks 72 in the respective sample shot regions are measured, it is readily understood that correction of the shape of each shot region can be executed in addition to the above-described alignment correction of the coordinate value of each shot region.

In this embodiment, the controller CU calculates the alignment amount. However, the present invention is not limited to this. For example, this may be performed by an online host apparatus that also comprehensively controls, via a network, other apparatuses in a factory in which the measurement apparatus 100 is installed. For example, the calculated alignment amount is transferred, via the online host, to an exposure apparatus that exposes the substrate 73 in the next step.

In step S210, the substrate 73 is unloaded from the measurement apparatus 100.

As described above, according to this embodiment, even if an overlay inspection mark is used as an alignment mark, measurement can be performed at high speed with high accuracy.

This embodiment has explained the processing of obtaining a correction amount for alignment with the target layer in the measurement apparatus 100 based on the position of the mark 72 including the first pattern P1 and the second pattern P2, but the present invention is not limited to this.

Figure 10:
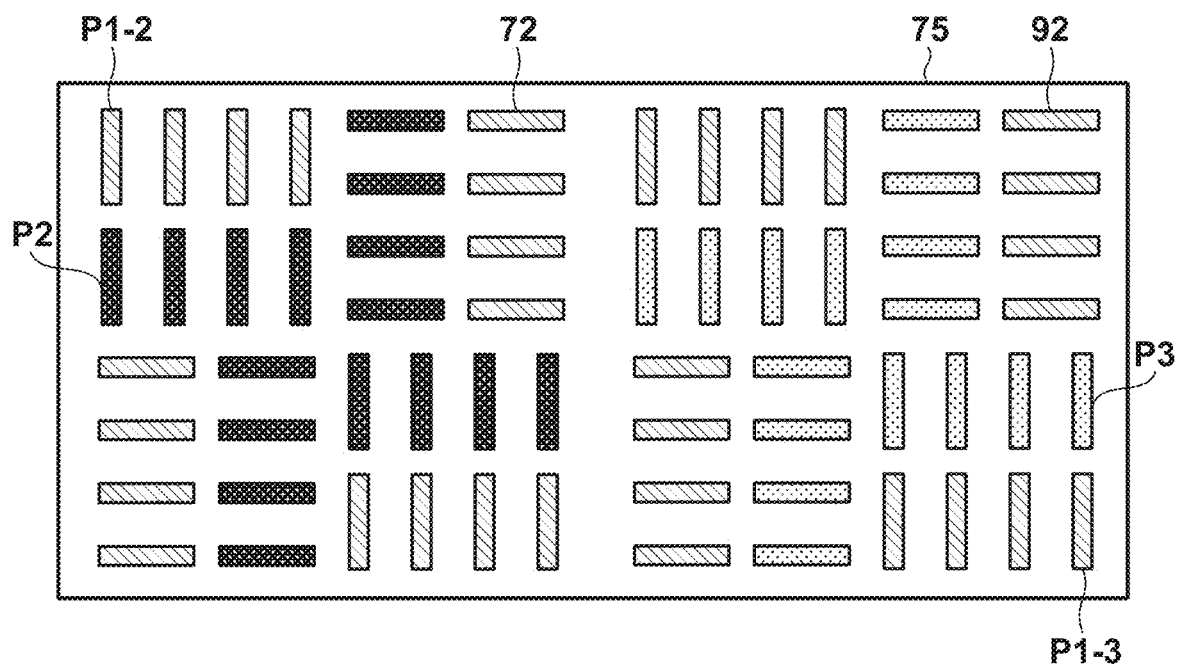
FIG. 10 is a view for explaining a modification of the first embodiment.

For example, if the first mark 72 and a second mark 92 simultaneously fall within the image capturing region of the image sensor 75 shown in FIG. 10, the measurement apparatus 100 can determine the position of each of the first mark 72 and the second mark 92 based on the above method. In this example, the second mark 92 includes a third pattern P3 in the third layer positioned by the target layer, and a first pattern P1-3 in the target layer.

More specifically, in step S203, the first mark 72 and the second mark 92 in the image capturing region can be captured. Subsequently, in step S204, based on detection signals generated based on the captured images of the marks 72 and 92 in step S203, the positions of a first pattern P1-2 and the first pattern P1-3 in the target layer 73L, the second pattern P2 in the second layer, and the third pattern P3 in the third layer can provisionally be determined.

In step S205, the controller CU acquires, for example, relative position information between the first pattern P1-2 and the second pattern P2 in the sample shot region measured in advance in overlay shift inspection in the previous step, and relative position information between the first pattern P1-3 and the third pattern P3.

In step S206, the controller CU performs conversion processing of the positions of the second pattern and the third pattern P3 measured in step S204. The position of the second pattern and the position of the third pattern after the conversion processing are represented by (Dx, Dy) and (Fx, Fy), respectively.

In step S207, the controller CU determines the position (Gx, Gy) of the mark 92 by the same method as that of determining the position (Ex, Ey) of the mark 72. More specifically, for example, the position (Gx, Gy) of the mark 92 can by determined by (Gx, Gy)=((Ax+Dx)/2+WSx, (Ay+Dy)/2+WSy).

In step S209, the controller CU can calculate an alignment amount using both or the average value of the position (Ex, Ey) of the mark 72 and the position (Gx, Gy) of the mark 92.

Second Embodiment

The second embodiment will be described below. Matters not mentioned in the second embodiment can comply with the first embodiment. The second embodiment will be described with reference to FIG. 6. The arrangement of a measurement apparatus 100, a substrate 73, and a mark 72 according to the second embodiment is the same as in the first embodiment. In the second embodiment as well, the position and shape of each shot region in a reference layer (target layer) are measured using the position of the mark 72 on the substrate 73, and relative position information between a first pattern P1 and a second pattern P2 acquired in advance. Steps S301 to S303, S305, and S308 to S310 shown in FIG. 6 are the same as steps S201 to S203, S205, and S208 to S210 described with reference to FIG. 4 and a detailed description thereof will be omitted.

In step S304, a controller CU provisionally determines information concerning the position of the substrate 73 as provisional position information based on a detection signal generated based on a captured image of the mark 72 acquired in step S303 (provisional determination step). In the second embodiment, the provisional position information is information indicating the position of the mark 72 determined based on both images of the first pattern P1 and the second pattern P2. In step S304 (provisional determination step), for example, the provisional position information can be determined by processing, by a mark detection module, a mark image formed by both the images of the first pattern P1 and the second pattern P2. The mark detection module can be a module that detects the position of a mark based on a provided image. The mark detection module may be a software module or a hardware module. The mark detection module can be configured to detect the position of the mark on the assumption that a provided image includes an image of one mark.

Figure 7A:
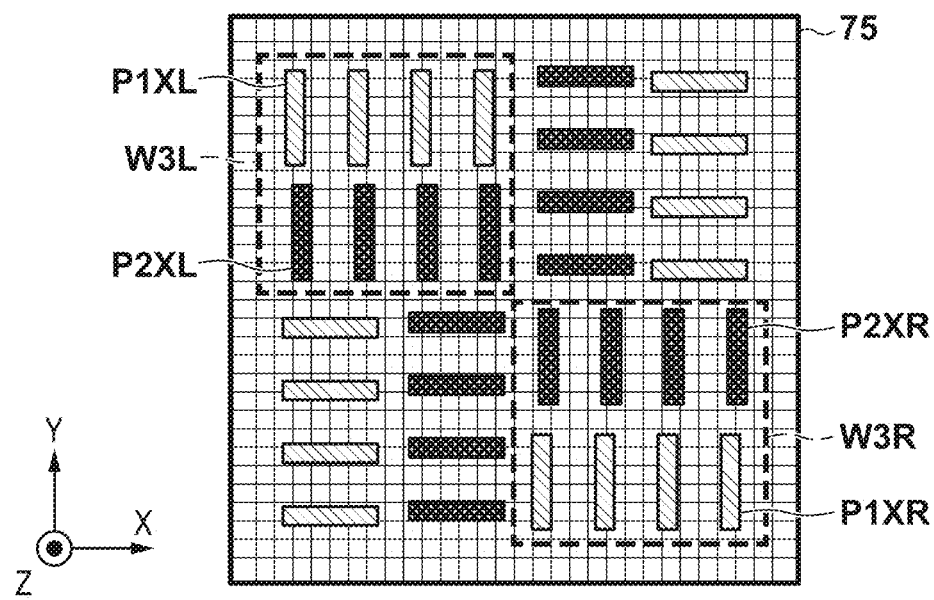
FIGS. 7A and 7B are views for explaining the measurement processing by the measurement apparatus according to the second embodiment.

The provisional determination step of determining the information concerning the position of the mark 72 as the provisional position information will now be described with reference to FIGS. 7A and 7B. FIG. 7A exemplifies an optical image of the mark 72 formed on the image capturing region (image capturing surface or detection surface) of an image sensor 75 shown in FIG. 1B, similar to FIG. 5A. A two-dimensional image sensor including the image capturing region formed by a plurality of pixels arrayed in the X direction and the Y direction can be used as the image sensor 75. The difference from the first embodiment is that the controller CU generates a detection signal for the X direction and a detection signal for the Y direction with respect to the first pattern P1 and the second pattern P2 based on an output from the image sensor 75.

Figure 7B:
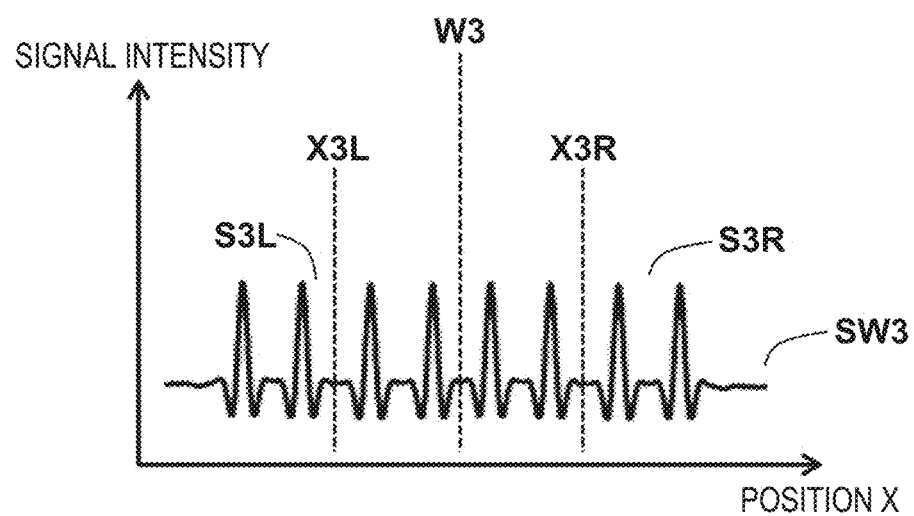

FIG. 7B shows an example of a detection signal SW3 of the first pattern P1 and the second pattern P2 generated when an evaluation region is set at once for a mark representing the position in the X direction with respect to a captured image obtained by capturing the mark 72 by the image sensor 75. Based on the designed position of the mark 72, the controller CU sets an evaluation region W3L to include a partial pattern P1XL of the first pattern P1 and a first partial pattern P2XL of the second pattern P2 with respect to the image capturing region of the image sensor 75. Furthermore, based on the designed position of the mark 72, the controller CU sets an evaluation region W3R to include a partial pattern P1XR of the first pattern P1 and a partial pattern P2XR of the second pattern P2. The detection signal SW3 is generated by integrating the signal intensities of the respective pixels in the set evaluation region in the Y direction. That is, the detection signal is obtained from a composite image of the first pattern P1 and the second pattern P2. A positional shift amount generated when forming the pattern exists between the partial pattern P1XL of the first pattern P1 and the partial pattern P2XL of the second pattern P2. Therefore, each peak signal of the detection signal SW3 includes a positional shift amount between the first pattern P1 and the second pattern P2.

In FIG. 7B, a waveform S3L included in the detection signal SW3 corresponds to the signal intensity obtained by compositing the partial pattern P1XL of the first pattern P1 and the partial pattern P2XL of the second pattern P2. Furthermore, in FIG. 7B, a waveform S3R corresponds to the signal intensity obtained by compositing the partial pattern P1XR of the first pattern P1 and the partial pattern P2XR of the second pattern P2. The controller CU can obtain a measurement value X3L representing the central position of a pattern PXL from the waveform S3L, and obtain a measurement value X3R representing the central position of a pattern PXR from the waveform S3R. Based on the measurement values X3L and X3R, the controller CU can determine, as provisional position information, information concerning the position of the mark 72 in the X direction. As for the mark in the Y direction as well, the controller CU can determine, as provisional position information, information concerning the position of the mark 72 in the Y direction.

In step S306, the controller CU performs conversion processing of converting the position of the mark 72 determined as the provisional position information in step S304 into the position of the mark 72 in the case in which the second pattern P2 is formed without any positional shift from the first pattern P1. The conversion processing is performed based on relative position information acquired in step S305. In the second embodiment, the conversion processing in step S306 corresponds to a final determination step of determining the position of the mark 72. The position of the mark 72 determined as the provisional position information in step S304 is obtained from a composite detection signal of the first pattern P1 in the target layer (first layer) and the second pattern P2 positioned with a positional shift from the target layer when forming the pattern in the second layer. Therefore, the position of the mark 72 provisionally determined in step S304 includes an error caused by the positional shift. The conversion processing is processing of reducing or canceling the error. The position of the mark 72 determined as the provisional position information in step S304 is represented by (Fx, Fy), and the relative position information (positional shift amount) acquired in step S305 is represented by (Cx, Cy). In this case, the position (Gx, Gy) of the mark 72 in the case in which the second pattern P2 is formed without any positional shift from the first pattern P1 is calculated by:

$$(Gx, Gy) = (Fx - Cx/2, Fy - Cy/2)$$

Note that (Gx, Gy) represents the position of the mark 72 in the coordinate system of an image capturing unit 50 (the position of the mark 72 in the visual field of the image capturing unit 50).

Similar to the first embodiment, the conversion processing of calculating (Gx, Gy) may be performed based on an offset value for correcting at least one of:

- a tool induced shift, so-called TIS, which is a measurement error by the measurement apparatus 100 for measuring the mark 72,
- a wafer induced shift, so-called WIS, (for example, an error caused by a difference in the three-dimensional shape of the surface of the mark 72 for each shot region), which is a measurement error by a process of processing the substrate 73, and
- an error caused by a TIS-WIS interaction between the tool induced shift (TIS) and the wafer induced shift (WIS).

In step S307, based on the position of the mark 72 having undergone the conversion processing in step S306 (the position of the mark 72 in the coordinate system of the image capturing unit 50), the controller CU performs conversion into the position of the mark 72 in the coordinate system of a substrate stage WS. A position (Hx, Hy) of the mark 72 in the coordinate system of the substrate stage WS can be given by:

$$(Hx, Hy) = (Gx + WSx, Gy + WSy)$$

where (WSx, WSy) represents the position of the substrate stage WS at the time of capturing the mark 72.

In the second embodiment, the position of the mark is provisionally determined based on both the partial pattern of the first pattern and the partial pattern of the second pattern, and is finally determined by correcting the provisionally determined position based on the relative position information between the first pattern and the second pattern.

Third Embodiment

Figure 8:
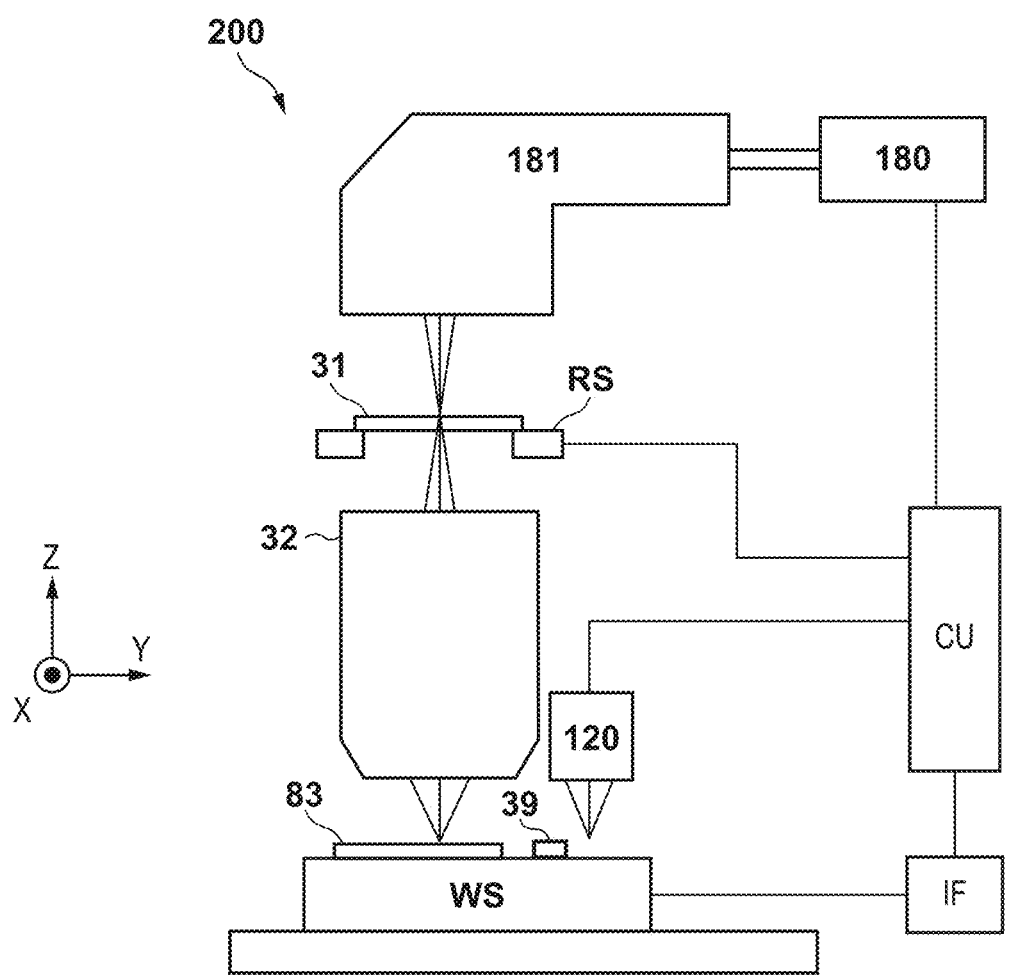
FIG. 8 is a view showing the arrangement of an exposure apparatus according to the third embodiment.

As the third embodiment, an exposure apparatus 200 including a measurement apparatus 100 represented by the first or second embodiment will be described next. FIG. 8 is a schematic view showing the arrangement of the exposure apparatus 200 according to the third embodiment. The exposure apparatus 200 is configured to transfer an original pattern to a substrate including the first layer with the first pattern and the second layer with the second pattern. The exposure apparatus 200 is an example of a lithography apparatus which is used in a lithography process as a manufacturing process of an article or a device such as a semiconductor device or a liquid crystal display device and forms a pattern on a substrate 83. The exposure apparatus 200 exposes a photoresist applied to the substrate 83 via a reticle 31 serving as an original, thereby transferring the pattern of the reticle 31 to the photoresist. A resist pattern is formed by developing the resist film. A pattern corresponding to the resist pattern can be formed in an underlying layer by etching the underlying layer using the resist pattern.

In this embodiment, the exposure apparatus 200 adopts a step-and-scan method, but it can also adopt a step-and-repeat method or other exposure methods. As shown in FIG. 8, the exposure apparatus 200 can include an illumination optical system 181, a reticle stage RS that holds the reticle 31, a projection optical system 32, a substrate stage WS that holds the substrate 83, a position measurement apparatus 120, and a controller CU.

The illumination optical system 181 is an optical system that illuminates an illuminated surface using light from a light source unit 180. The light source unit 180 includes, for example, a laser. The laser can be an ArF excimer laser having a wavelength of about 193 nm or a KrF excimer laser having a wavelength of about 248 nm, but the type of light source is not limited to the excimer laser. For example, the light source unit 180 may use, as the light source, an F2 laser having a wavelength of about 157 nm or extreme ultraviolet (EUV) having a wavelength of 20 nm or less.

In this embodiment, the illumination optical system 181 shapes the light from the light source unit 180 into slit light having a predetermined shape suitable for exposure, and illuminates the reticle 31. The illumination optical system 181 has a function of uniformly illuminating the reticle 31 and a polarizing illumination function. The illumination optical system 181 includes, for example, a lens, a mirror, an optical integrator, and a stop, and is formed by arranging a condenser lens, a fly-eye lens, an aperture stop, a condenser lens, a slit, and an imaging optical system in this order.

The reticle 31 is made of, for example, quartz. The reticle 31 is formed with a pattern (circuit pattern) to be transferred to the substrate 83. The reticle stage RS holds the reticle 31 via a reticle chuck (not shown), and is connected to a reticle driving mechanism (not shown). The reticle driving mechanism includes a linear motor, and can move the reticle 31 held by the reticle stage RS by driving the reticle stage RS in the X-axis direction, the Y-axis direction, the Z-axis direction, and the rotation directions around the respective axes. Note that the position of the reticle 31 is measured by a reticle position measurement unit of light oblique-incidence type (not shown), and the reticle 31 is arranged at a predetermined position via the reticle stage RS.

The projection optical system 32 has a function of imaging the light from an object plane in an image plane. In this embodiment, the projection optical system 32 projects the light (diffracted light) having passed through the pattern of the reticle 31 onto the substrate 83, thereby forming the image of the pattern of the reticle 31 on the substrate. As the projection optical system 32, an optical system formed from a plurality of lens elements, an optical system (catadioptric optical system) including a plurality of lens elements and at least one concave mirror, an optical system including a plurality of lens elements and at least one diffractive optical element such as kinoform, or the like is used.

The substrate 83 is a processing target object to which the pattern of the reticle 31 is transferred, and can be a wafer, a liquid crystal substrate, or another processing target substrate. The substrate stage WS holds the substrate 83 via a substrate chuck (not shown), and is connected to a substrate driving mechanism (not shown). The substrate driving mechanism includes a linear motor, and can move the substrate 83 held by the substrate stage WS by driving the substrate stage WS in the X-axis direction, the Y-axis direction, the Z-axis direction, and the rotation directions around the respective axes. Furthermore, a reference plate 39 is provided on the substrate stage WS.

The position of the reticle stage RS and the position of the substrate stage WS are monitored by, for example, a 6-axis laser interferometer IF or the like, and the reticle stage RS and the substrate stage WS are driven at a constant speed ratio under the control of the controller CU.

The controller CU is formed by a computer (information processing apparatus) including a CPU and a memory and, for example, operates the exposure apparatus 200 by comprehensively controlling the respective units of the exposure apparatus 200 in accordance with a program stored in a storage unit. The controller CU controls exposure processing of transferring the pattern of the reticle 31 to the substrate 83 by exposing the substrate 83 via the reticle 31. Furthermore, in this embodiment, the controller CU controls measurement processing in the position measurement apparatus 120 and correction processing (calculation processing) of a measurement value obtained by the position measurement apparatus 120. In this way, the controller CU also functions as part of the position measurement apparatus 120.

In the exposure apparatus 200, the light (diffracted light) having passed through the reticle 31 is projected onto the substrate 83 via the projection optical system 32. The reticle 31 and the substrate 83 are arranged in an optically conjugate relationship. The pattern of the reticle 31 is transferred to the substrate 83 by scanning the reticle 31 and the substrate 83 at a speed ratio of a reduction ratio of the projection optical system 32.

The position measurement apparatus 120 is a measurement apparatus for measuring the position of a target object. In this embodiment, the position measurement apparatus 120 measures the position of an alignment mark 82 provided in the substrate 83. The alignment mark 82 is an overlay inspection mark, similar to the mark 72. The position measurement apparatus 120 can have the same arrangement as that of the above-described measurement apparatus 100.

Figure 9:
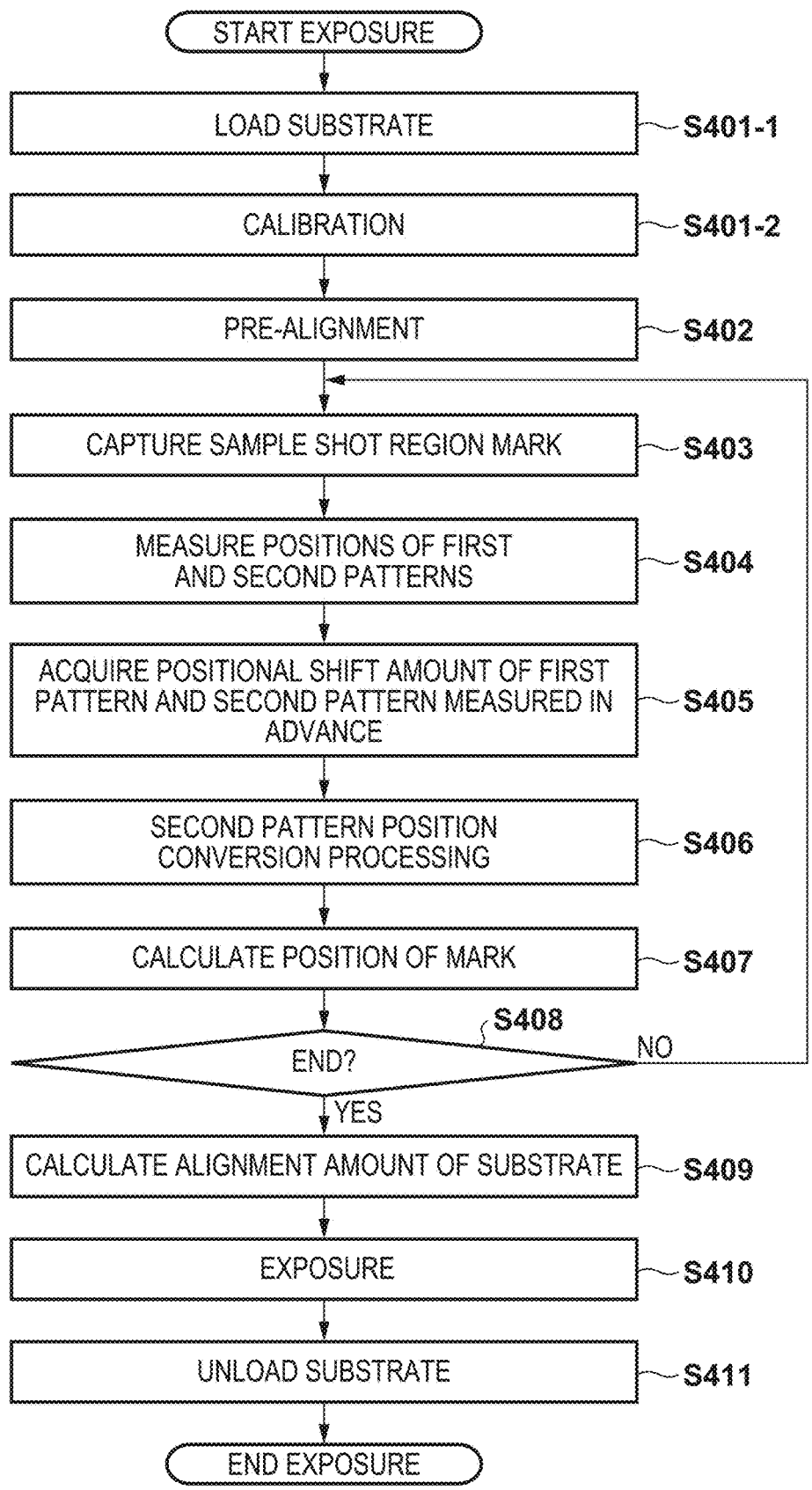
FIG. 9 is a flowchart illustrating exposure processing by the exposure apparatus according to the third embodiment.

The operation of the exposure apparatus 200 when the measurement apparatus 100 of the first embodiment is applied to the position measurement apparatus 120 will be described below with reference to FIG. 9. However, the measurement apparatus 100 of the second embodiment may be applied to the position measurement apparatus 120. The exposure apparatus 200 performs exposure processing by positioning the pattern of the reticle 31 in the layer as the reference of the substrate 83 based on the position of the alignment mark 82 of the substrate 83. The exposure processing is performed when the controller CU comprehensively controls the respective units of the exposure apparatus 200. Steps S402 to S408 shown in FIG. 9 are the same as steps S202 to S208 described with reference to FIG. 4 and a detailed description thereof will be omitted.

In step S401-1, the substrate 83 is loaded in the exposure apparatus 200. In step S401-2, calibration is performed. More specifically, based on the designed coordinate position of the reference mark provided in the reference plate 39 in the coordinate system of the substrate stage WS, the substrate stage WS is driven so as to position the reference mark on the optical axis of the position measurement apparatus 120. Then, the positional shift of the reference mark with respect to the optical axis of the position measurement apparatus 120 is measured, and the coordinate system of the substrate stage WS is reset based on the positional shift such that the origin of the coordinate system of the substrate stage WS coincides with the optical axis of the position measurement apparatus 120. Next, based on the designed positional relationship between the optical axis of the position measurement apparatus 120 and the optical axis of the projection optical system 32, the substrate stage WS is driven so as to position the reference mark on the optical axis of the exposure light. Then, the positional shift of the reference mark with respect to the optical axis of the exposure light is measured via the projection optical system 32 by a Through The Lens (TTL) measurement system. Based on the above result, the baseline between the optical axis of the position measurement apparatus 120 and the optical axis of the projection optical system 32 is determined.

In step S409, the alignment amount of the substrate 83 is calculated based on the measured positions of the alignment marks 82 in all the sample shot regions, similar to step S209 shown in FIG. 4. Steps S403 to S409 correspond to an alignment measurement step of determining the positions of the plurality of shot regions based on the position of the mark in each of the plurality of sample shot regions. In step S409, global alignment is performed in which based on data of the design values and the actual measurement values (differences from the design coordinate values) of the alignment marks 82 in the sample shot regions, the shift of the shot region and a primary linear component (magnification and rotation) are obtained. Depending on the number of measurement points of the sample shot regions, the array of the shot regions can be corrected by a multidimensional polynomial like equations (1) in the first embodiment. Furthermore, the alignment amount of the substrate can also be obtained by combining the correction value of global alignment by the exposure apparatus and the correction value of each shot region or the multidimensional polynomial measured by the measurement apparatus 100 of the first embodiment.

In step S410, the substrate 83 is exposed while scanning the reticle 31 and the substrate 83 in a scanning direction (Y direction) (exposure step). More specifically, based on the baseline amount in step S401-2 and the alignment amount of the substrate in step S409, the substrate 83 is aligned with a target position, and the pattern of the reticle 31 is transferred to each shot region of the substrate 83 via the projection optical system 32. In step S411, the substrate 83 is unloaded from the exposure apparatus 200.

As described above, according to this embodiment, there can be provided an exposure apparatus capable of performing measurement at high speed with high accuracy even if an overlay inspection mark is used as an alignment mark.

Fourth Embodiment

As the fourth embodiment, an article manufacturing method of manufacturing a device (article) using the exposure apparatus according to the third embodiment will be described below. The article manufacturing method is suitable for, for example, manufacturing an article such as a device (a semiconductor device, a magnetic storage medium, a liquid crystal display device, or the like). The manufacturing method includes a step of exposing, by using an exposure apparatus 200, a substrate with a photosensitive agent applied thereon (forming a pattern on the substrate), and a step of developing the exposed substrate (processing the substrate). In addition, the manufacturing method can include other well-known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-010359, filed Jan. 26, 2022, which is hereby incorporated by reference herein in its entirety.

What is claimed is:

1. A method of determining a position of a mark including a first pattern arranged in a first layer of a substrate and a second pattern arranged in a second layer of the substrate, the second layer being arranged on the first layer, the method comprising:
   determining provisional position information concerning the mark, including information of a position of the first pattern and information of a position of the second pattern, based on an image of the mark;
   acquiring relative position information indicating a shift amount of overlay between the first pattern and the second pattern; and
   determining the position of the mark by correcting the provisional position information based on the relative position information.

2. The method according to claim 1, wherein
   the first layer includes a plurality of first patterns, and the second layer includes a plurality of second patterns,
   the method further comprises measuring, after formation of the first layer and the second layer on the substrate and before the determining the provisional position information, a relative position between a first pattern selected from the plurality of first patterns and a second pattern corresponding to the selected first pattern among the plurality of second patterns, and
   in the acquiring, the relative position information is acquired based on a result of the measuring.

3. The method according to claim 1, wherein in the determining the position of the mark,
   based on the relative position information, conversion processing of converting the position of the second pattern determined in the determining the provisional position information into the position of the second pattern in a case in which the second pattern is formed without any overlay shift from the first pattern is performed, and
   the position of the mark is determined based on the position of the first pattern determined in the determining the provisional position information and the position of the second pattern having undergone the conversion processing.

4. The method according to claim 3, wherein the conversion processing is performed based on an offset value for correcting at least one of a tool induced shift which is a measurement error by a measurement apparatus for measuring the mark, a wafer induced shift which is a measurement error by a process of processing the substrate, and an error caused by an interaction between the tool induced shift and the wafer induced shift.

5. The method according to claim 3, wherein when the position of the mark is determined based on the position of the first pattern determined in the determining the provisional position information and the position of the second pattern having undergone the conversion processing, the position of the first pattern determined in the determining the provisional position information and the position of the second pattern having undergone the conversion processing are weighted.

6. The method according to claim 1, wherein the provisional position information determined in the determining the provisional position information is information indicating the provisional position of the mark obtained by processing an image signal corresponding to the first pattern and an image signal corresponding to the second pattern based on images of the first pattern and the second pattern.

7. The method according to claim 6, wherein in the determining the position of the mark, the position of the mark is finally determined based on an offset value for correcting at least one of a tool induced shift which is a measurement error by a measurement apparatus for measuring the mark, a wafer induced shift which is a measurement error by a process of processing the substrate, and an error caused by an interaction between the tool induced shift and the wafer induced shift.

8. The method according to claim 1, wherein
   in the determining the provisional position information, the provisional position information is determined by processing, by a mark detection module, a mark image formed by images of the first pattern and the second pattern, and the mark detection module is a module configured to detect the provisional position of a mark based on a provided image.

9. The method according to claim 1, wherein the first pattern and the second pattern correspond to a mark for measuring an overlay error between the first layer and the second layer.

10. The method according to claim 9, wherein in the mark, the second pattern falls within a rectangular region circumscribing the first pattern.

11. The method according to claim 9, wherein
the first pattern includes a plurality of first partial patterns, and the second pattern includes a plurality of second partial patterns, and
in the mark, at least part of at least one of the plurality of second partial patterns is arranged between at least two first partial patterns among the plurality of first partial patterns.

12. A lithography method of transferring an original pattern to a substrate including a first layer with a first pattern and a second layer with a second pattern, comprising:
determining a position of a mark including the first pattern and the second pattern in accordance with the method of determining the position of the mark defined in claim 1; and
transferring the original pattern to the substrate by aligning the original pattern with the first layer based on the position of the mark determined in the determining.

13. The method according to claim 12, wherein
the substrate includes a plurality of shot regions, and
in the determining the position of the mark, relative position information is acquired by measuring a relative position between the first pattern and the second pattern in a plurality of sample shot regions among the plurality of shot regions.

14. The method according to claim 13, further comprising determining positions of the plurality of shot regions based on the position of the mark in each of the plurality of sample shot regions,
wherein the transferring includes exposing the plurality of shot regions based on a result of the determining the positions of the plurality of shot regions.

15. The method according to claim 12, wherein
the determining the position of the mark includes acquiring an image of the mark by capturing the mark on the substrate held by a substrate stage, and
in the determining the position of the mark, the position of the mark in a coordinate system of the substrate stage is determined based on the position of the mark and a position of the substrate stage at the time of performing the acquiring.

16. An article manufacturing method comprising:
forming a resist pattern on a substrate in accordance with a lithography method defined in claim 12; and
obtaining an article by processing the substrate on which the pattern has been formed.

17. The method according to claim 1, wherein in the determining the position of the mark, the position of the mark is determined by performing calculation processing on the provisional position information and the relative position information, in which the relative position information is subtracted from the provisional position information.

18. An exposure apparatus for transferring an original pattern to a substrate including a first layer with a first pattern and a second layer with a second pattern, comprising:
an image capturing unit configured to capture an image of a mark including the first pattern and the second pattern; and
a controller configured to (i) determine provisional position information concerning the mark, including information of a position of the first pattern and information of a position of the second pattern, based on the image of the mark captured by the image capturing unit, (ii) determine a position of the mark by correcting the provisional position information based on relative position information indicating a shift amount of overlay between the first pattern and the second pattern, and (iii) control exposure processing for a shot region of the substrate based on the position of the mark.

* * * * *